United States Patent [19]

Hong

[11] Patent Number: 5,748,475
[45] Date of Patent: May 5, 1998

[54] APPARATUS AND METHOD OF ORIENTING ASYMMETRICAL SEMICONDUCTOR DEVICES IN A CIRCUIT

[75] Inventor: Merit Y. Hong, Chandler, Ariz.

[73] Assignee: Motorola, Inc., Schaumburg, Ill.

[21] Appl. No.: 452,899

[22] Filed: May 30, 1995

[51] Int. Cl.[6] .............................. G06F 15/00; H01L 27/10
[52] U.S. Cl. .......................... 364/491; 364/490; 327/427;
327/437; 327/565; 327/566; 257/408; 257/344;
257/366
[58] Field of Search ..................... 395/500; 364/488–491;
257/408, 344, 366; 327/427, 437, 565,
566

[56] References Cited

U.S. PATENT DOCUMENTS

| | | | |
|---|---|---|---|
| 4,488,066 | 12/1984 | Shoji | 307/452 |
| 5,224,056 | 6/1993 | Chene et al. | 364/490 |
| 5,286,664 | 2/1994 | Horiuchi | 437/44 |
| 5,365,454 | 11/1994 | Nakagawa et al. | 364/491 |
| 5,513,124 | 4/1996 | Trimberger et al. | 364/491 |
| 5,566,080 | 10/1996 | Yokoi | 364/491 |
| 5,598,347 | 1/1997 | Iwasaki | 364/491 |
| 5,608,240 | 3/1997 | Kumagai | 257/204 |

OTHER PUBLICATIONS

A Mixed Asymmetric/Symmetric (Mass) MOSFET Cell for ASIC Kumagi et al, Apr. 1994, IEEE, pp. 116–119.

*Primary Examiner*—Kevin J. Teska
*Assistant Examiner*—Herbert McNair
*Attorney, Agent, or Firm*—Robert D. Atkins

[57] ABSTRACT

A computer implemented method provides for orientation and lay-out asymmetrical semiconductor devices. The sources of operating potential (20, 30) are identified. The PMOS transistors (22–28) are combined between the first (more positive) source of operating potential and a common node (12) into a combination block (48). The NMOS transistors (14–18) are combined between the common node and the second (less positive) source of operating potential into another combination block (52). The PMOS source terminals are coupled to more positive potentials, and the PMOS drain terminals are coupled to less positive potentials within the first combination block. The NMOS source terminals are coupled to less positive potentials, and the NMOS drain terminals are coupled to more positive potentials within the second combination block. For transmission gates (60, 62), a driving source is identified and the PMOS and NMOS source terminals are coupled to the driving source.

14 Claims, 4 Drawing Sheets

APPARATUS AND METHOD OF ORIENTING ASYMMETRICAL SEMICONDUCTOR DEVICES IN A CIRCUIT

BACKGROUND OF THE INVENTION

The present invention relates in general to circuit design and, more particularly, to a computer-aided design methodology for orienting asymmetrical semiconductor devices in a circuit.

Integrated circuit (ICs) are often laid-out with symmetrical devices. A symmetrical semiconductor device is, for example, an MOS transistor having identical source and drain conduction regions. It generally does not matter in the lay-out of the IC which conduction region is used as the drain and which conduction region is used as the source because both regions are the same. The transistor operates equally well with either conduction region connected to the higher potential. The symmetrical construction of the drain and source simplifies the manufacturing steps. For an NMOS (n-channel MOS) transistor, only after the symmetrical device is laid-out is the region that is connected to a higher potential labeled as the drain and the region that is connected to the lower potential labeled as the source. For a PMOS (p-channel MOS) transistor, only after the symmetrical device is laid-out is the region that is connected to a higher potential labeled as the source and the region that is connected to the lower potential labeled as the drain.

The modern trend is toward asymmetrical devices, where the conduction regions differ. For example, in an asymmetrical power MOSFET, the source region is constructed differently than the drain region in order to switch large currents. If the source region is connected to the positive supply, the MOSFET will most likely fail. Asymmetrical devices also differ in that the transistor may include an additional diffusion region that wraps around the source of the device to enhance conduction in one direction. Thus, the asymmetrical configuration offers improved performance over its symmetrical counterpart when operating in one conduction direction.

There are a number of existing and proven schematic designs that use symmetrical devices. These designs can be improved upon by substituting asymmetrical devices for the symmetrical ones without changing the schematic structure. Unfortunately, most software lay-out tools do not provide for automatic orientation of asymmetrical devices in existing schematic designs. It is equally desirable to have a software lay-out tool that orients and verifies asymmetrical devices in new and original designs.

Hence, a need exists to orient asymmetrical semiconductor devices during IC lay-out and design.

DETAILED DESCRIPTION OF THE PREFERRED EMBODIMENT

Figure 1:
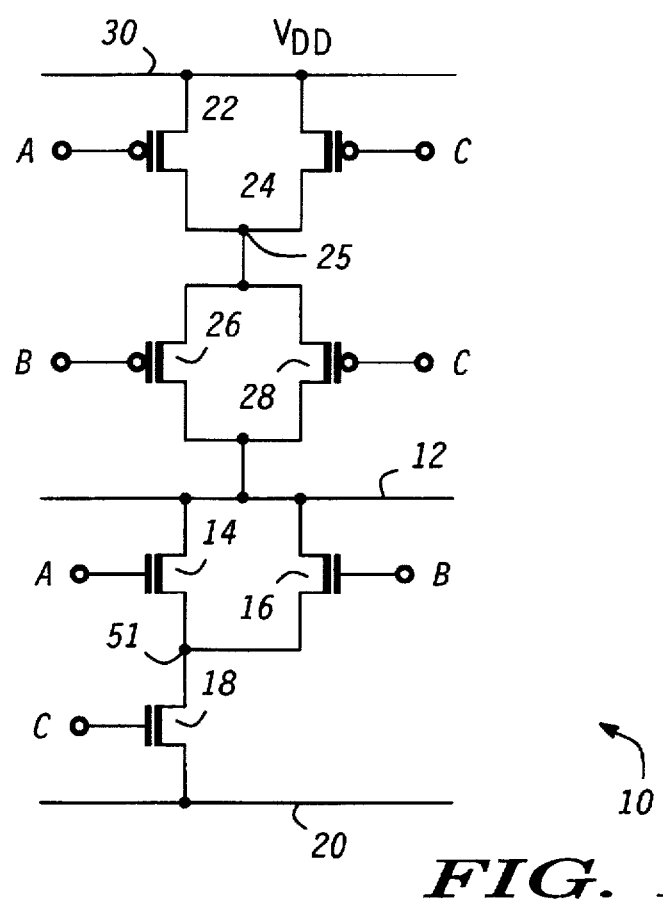
FIG. 1 is a schematic diagram illustrating a circuit design.

Referring to FIG. 1, a schematic design 10 is shown for pulling bus 12 to logic one or logic zero. Transistors 14 and 16 are connected in parallel. Transistor 18 is connected in series with the parallel combination of transistors 14 and 16. Bus 12 receives a logic zero from power supply conductor 20 operating at ground potential only when control signal A or B is high, and control signal C is high. Bus 12 must be isolated from the positive supply when it is connected to ground. The parallel combinations of transistors 22 and 24, and transistors 26 and 28, are arranged to provide the isolation from power supply conductor 30 operating at a positive potential such as $V_{DD}$=5.0 volts. If control signal C is high, transistor 24 and 28 are off. If control signal A or B is high, transistor 22 or transistor 26 is off thereby isolating bus 12 from power supply conductor 30. If control signal C is low, or if control signals A and B are both low, then bus 12 receives a logic one from power supply conductor 30. In that case transistors 14–18 are turned off to isolate bus 12 from power supply conductor 20.

In an alternate embodiment, transistors 24 and 28 can be replaced with a single PMOS transistor (not shown) between power supply conductor 30 and bus 12 operating in response to control signal C.

The transistors shown in FIG. 1 have traditionally been symmetrical devices. In the prior art, either conduction region may be connected to the higher potential because of the device symmetry. Therefore, the prior art software lay-out tools have not been concerned with device orientation because the transistors were symmetrical. In order to achieve more versatile designs with higher performance, it is desirable to substitute asymmetrical transistors for the symmetrical transistors in the prior design. The lay-out must now be sensitive to orientation of the transistor because of their asymmetrical properties.

As part of the present invention, a process of orienting asymmetrical semiconductor devices is performed in computer-aided design (CAD) software on a computer system such as a personal workstation. The computer system with its processor, memory and coding provide the means of performing the steps of FIG. 2. In step 32 of FIG. 2, the lay-out process includes identifying relative sources of operating potentials in the circuit design. Power supply conductor 30 is a first source of operating potential that is more positive than a second source of operating potential at power supply conductor 20. Step 34 combines a first type of asymmetrical semiconductor device between power supply conductor 30 and a common node, such as bus 12, into a first combination block. For example, transistors 22 and 24 are asymmetrical PMOS transistors each having different drain and source regions and therefore must be oriented for proper operation. Transistors 22 and 24 are combined in parallel in combination block 44 in FIG. 3 that performs an "OR" operation on the control signals A and C asserted low. If control signal A or control signal C is low, then combination block 44 is enabled to pass on the first source of operating potential to node 25.

Figure 4:
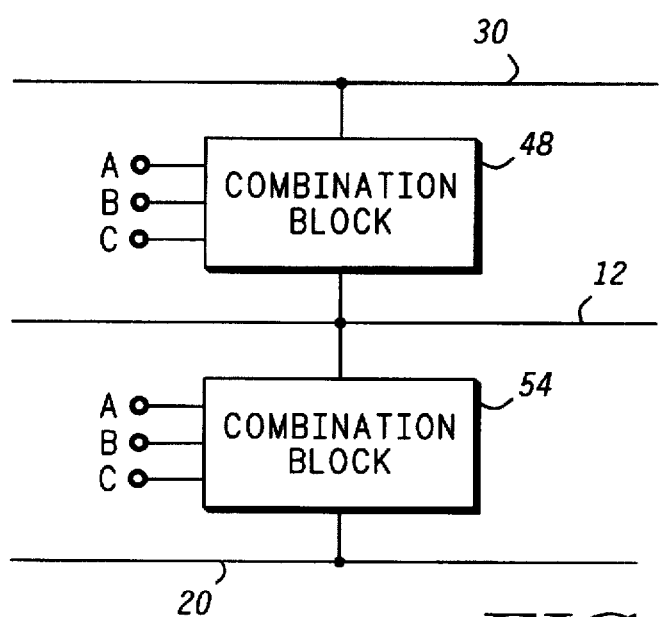
FIG. 4 is a block diagram illustrating further combination blocks of the circuit design of FIG. 1.

Transistors 26 and 28 are also asymmetrical PMOS transistors each having different drain and source regions and therefore must be oriented for proper operation. Transistors 26 and 28 are combined in parallel in combination block 46 that performs an "OR" operation on the control signals B and C. If control signal B or control signal C is low, then combination block 46 is enabled to pass on the first source of operating potential from node 25 to bus 12 to bring it to logic one. Next, block 44 is combined in series with block 46 to provide an overall combination block 48 that receives control signals A, B, and C as shown in FIG. 4. Combination block 48 is a representation of the switching action of all PMOS transistors 22–28 in response to control signals A, B, and C. That is, combination block 48 has a logical operation of ($\overline{A}$ or $\overline{C}$) and ($\overline{B}$ or $\overline{C}$) to enable a path between power supply conductor 30 and bus 12.

Step 36 combines a second type of asymmetrical semiconductor device between the common node and power supply conductor 20 into a second combination block. For example, transistor 18 is an asymmetrical NMOS transistor having different drain and source regions. Transistor 18 must be oriented for proper operation. Transistor 18 is placed in combination block 50 in FIG. 3 and responds to control signal C. If control signal C is high, then combination block 50 is enabled to pass on the second source of operating potential to node 51. Transistors 14 and 16 are also asymmetrical NMOS transistors each having different drain and source regions and therefore must be oriented for proper operation. Transistors 14 and 16 are combined in parallel in combination block 52 that performs an "OR" operation on the control signals A and B. If control signal A or control signal B is high, then combination block 52 is enabled to pass on the second source of operating potential from node 51 to bus 12 to bring it to logic zero. Next, block 50 is combined in series in block 52 to provide an overall combination block 54 that receives control signals A, B, and C as shown in FIG. 4. Combination block 54 is a representation of the switching action of all NMOS transistors 14-18 in response to control signals A, B, and C. That is, combination block 54 has a logical operation of (A or B) and C to enable a path between bus 12 and power supply conductor 20.

Step 38 couples source terminals of the first type of asymmetrical semiconductor device to more positive potentials and couples drain terminals of the first type of asymmetrical semiconductor device to less positive potentials within the first combination block. Transistors 22 and 24 are asymmetrical PMOS devices and each has a first conduction terminal (source) that must be coupled to a higher potential than its second conduction terminal (drain) for proper operation. For example, the sources of transistors 22 and 24 may be different in that they have an additional diffusion region that wraps around the source of the device to enhance conduction in one direction. Accordingly, the CAD lay-out tool couples the source terminals of transistors 22 and 24 in FIG. 1 to the more positive power supply conductor 30. The drain terminals of transistors 22 and 24 are coupled to node 25 which is less positive with respect to power supply conductor 30. Likewise, transistors 26 and 28 are asymmetrical PMOS devices and each has a first conduction terminal (source) that must be coupled to a higher potential than its second conduction terminal (drain) for proper operation. The sources of transistors 26 and 28 may be different in that they have an additional diffusion region that wraps around the source of the device to enhance conduction in one direction. The CAD lay-out tool couples the source terminals of transistors 26 and 28 to node 25. The drain terminals of transistors 26 and 28 are coupled to bus 12 which is less positive with respect to the more positive node 25.

Step 40 couples source terminals of the second type of asymmetrical semiconductor device to less positive potentials and couples drain terminals of the second type of asymmetrical semiconductor device to more positive potentials within the second combination block. Transistor 18 is an asymmetrical NMOS device and has a first conduction terminal (drain) that must be coupled to a higher potential than its second conduction terminal (source) for proper operation. Accordingly, the source terminals of transistor 18 in FIG. 1 is coupled to the less positive power supply conductor 20. The drain terminal of transistor 18 is coupled to node 51 which is more positive with respect to power supply conductor 20. Likewise, transistors 14 and 16 are asymmetrical NMOS devices and each has a first conduction terminal (drain) that must be coupled to a higher potential than its second conduction terminal (source) for proper operation. The source terminals of transistors 14 and 16 are coupled to node 51. The drain terminals of transistors 14 and 16 are coupled to the bus 12 which is more positive with respect to the less positive node 51.

Thus, the asymmetric PMOS transistors 22-28 have been identified and oriented through CAD software so that the source terminals are coupled to the more positive nodes and the drain terminals are coupled to the less positive nodes within combination block 48. Similarly, the asymmetric NMOS transistors 14-18 have been identified and oriented through CAD software so that the source terminals are coupled to the less positive nodes and the drain terminals are coupled to the more positive nodes within combination block 54. The computer implemented method of the present invention has laid-out the asymmetrical PMOS and NMOS transistors in schematic design 10 to that the drain and source terminals are oriented for proper operation.

The step of combining the transistors in combination block serves to identify the break point, e.g. bus 12, between PMOS devices and NMOS devices. All the PMOS transistors on one side of the break point are combined into a single functional block 48. All the NMOS transistors on the other side of the break point are combined into a single functional block 54. Once the all-PMOS and all-NMOS functional blocks are identified, the lay-out software begins assigning the asymmetrical drains and sources to the operating potentials. On the PMOS side, the sources of the upper-most PMOS transistors, e.g. transistors 22 and 24, are connected to the highest potential, e.g. power supply conductor 30, and their drains are connected to next lower node, e.g. node 25. The sources of the next upper-most PMOS transistors, e.g. transistors 26 and 28, are connected to the next highest potential, e.g. node 25, and their drains are connected to the next lower node, e.g. bus 12.

On the NMOS side, the sources of the lower-most NMOS transistors, e.g. transistor 18, are connected to the lowest potential, e.g. power supply conductor 20, and its drain are connected to next higher node, e.g. node 51. The sources of the next lower-most NMOS transistors, e.g. transistors 14 and 16, are connected to the next highest potential, e.g. node 51, and their drains are connected to the next higher node, e.g. bus 12, to complete the lay-out of schematic design 10.

The process described above works for practically any semiconductor device where the source terminals and drain terminals are coupled between known sources of operating potential, e.g. power supply conductors 20 and 30. The schematic design 10 in FIG. 1 provides an example of bus pull-up and pull-down circuit. Other examples include inverters, AND gates, OR gates, and so on. Each of these semiconductor devices have their source and drain terminals coupled between known or identifiable sources of operating potential. The data input signals to the semiconductor devices are processed through the respective gate terminals of the transistors. The process described in FIG. 2 can be applied to these asymmetrical semiconductor devices to orient and lay-out the drain terminals and sources terminals.

Figure 5:
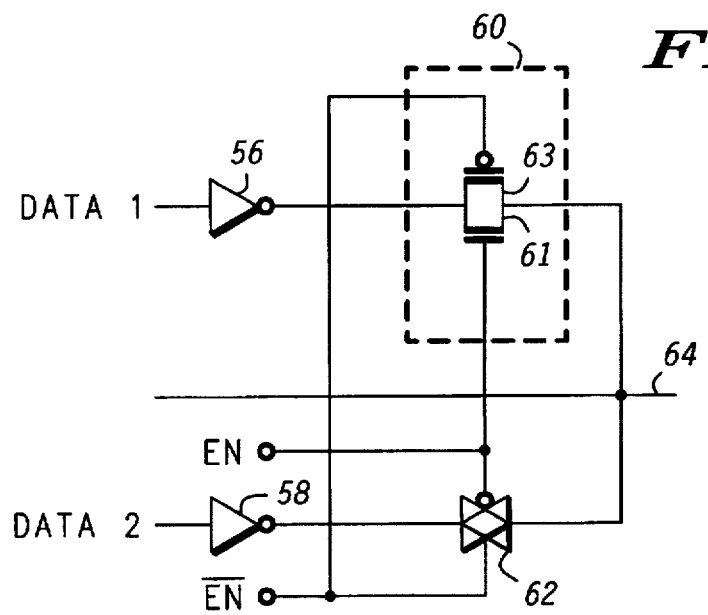
FIG. 5 is a schematic diagram illustrating another circuit design.

A variation on the aforedescribed process is needed for some transmission gate configurations such as shown in FIG. 5. DATA1 is complemented by inverter 56 and driven onto bus 64 when transmission gate 60 is enabled by control signals EN and $\overline{EN}$. DATA2 is complemented by inverter 58 and driven onto bus 64 when transmission gate 62 is enabled by control signals EN and $\overline{EN}$. Inverters 56 and 58 have their drain and sources terminals coupled between known sources of operating potential and are therefore analyzed according to the steps of FIG. 2. Transmission gate 60 comprises back-to-back NMOS transistor 61 and PMOS transistor 63 each having one conduction terminal coupled to the output of inverter 56 and one conduction terminal coupled to bus 64. Control signal EN is applied to the gate of transistor 61 and control signal $\overline{EN}$ is applied to the gate of transistor 63. Transmission gate 62 comprises back-to-back NMOS and PMOS transistors as shown for transmission gate 60 each having one conduction terminal coupled to the output of inverter 58 and one conduction terminal coupled to bus 64. Control signal EN is applied to the gate of the PMOS transistor and control signal $\overline{EN}$ is applied to the gate of the NMOS transistor in transmission gate 62. The primary concern is that the drain and source terminals of the transistors in transmission gates 60 and 62 are not coupled between known power supply conductors as in FIG. 1.

Figure 2:
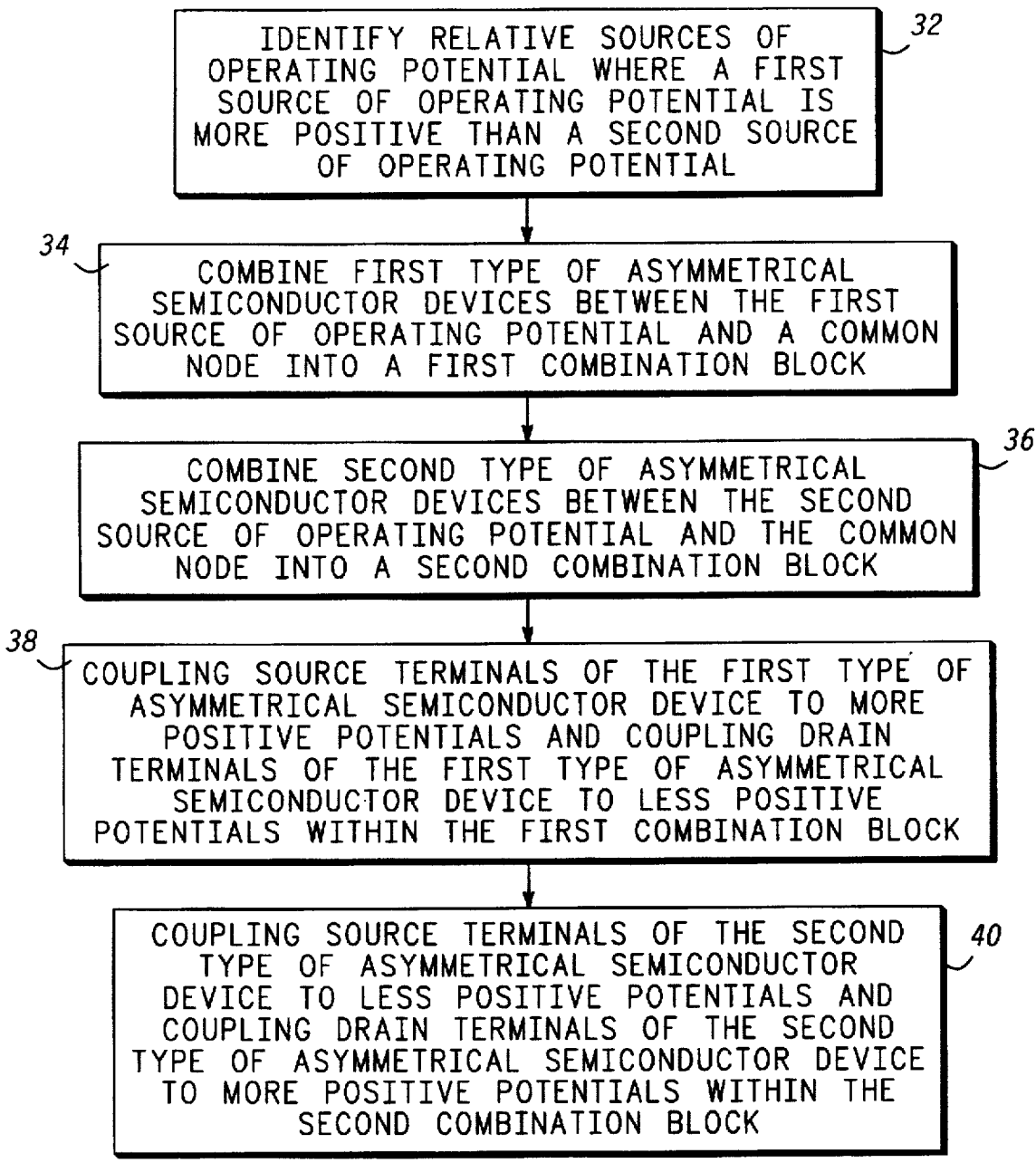
FIG. 2 is a flowchart describing steps of laying-out asymmetrical semiconductor devices in the circuit design of FIG. 1.
Figure 3:
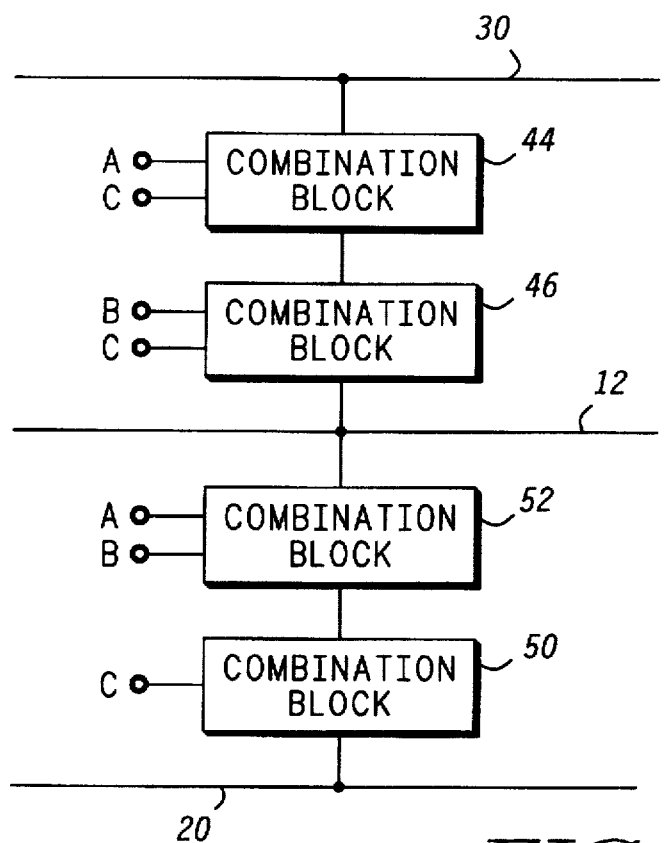
FIG. 3 is a block diagram illustrating combination blocks of the circuit design of FIG. 1.

The lay-out process for the schematic design shown in FIG. 5 involves first analyzing inverters 56 and 58 according to the steps described in FIG. 2. Inverters 56 and 58 typically each comprise a PMOS transistor having a source terminal coupled to the positive power supply and an NMOS transistor having a source terminal coupled to ground. Next, the lay-out process must have identified the driving-source into the conduction terminals of the respective transmission gates. The output of inverter 56 at the interconnection between the drains of the PMOS and NMOS transistors is pre-identified from the design information as the driving-source to transmission gate 60. The output of inverter 58 at the interconnection between the drains of the PMOS and NMOS transistors is pre-identified from the design information as the driving-source to transmission gate 62.

The CAD lay-out software couples the sources of the asymmetrical NMOS and PMOS transistors in transmission gate 60 to the driving-source at the output of inverter 56. The drains of the asymmetrical NMOS and PMOS transistors in transmission gate 60 is coupled to a receiving node at bus 64. The lay-out software couples the sources of the asymmetrical NMOS and PMOS transistors in transmission gate 62 to the driving-source at the output of inverter 58. The drains of the asymmetrical NMOS and PMOS transistors in transmission gate 62 is coupled to the receiving node at bus 64.

Thus, the asymmetric NMOS and PMOS transistors in transmission gates 60 and 62 have been identified and oriented through CAD lay-out software so that the source terminals are coupled to the driving-source and the drain terminals are coupled to the receiving node, e.g. bus 64. The computer implemented method of the present invention has laid-out the asymmetrical PMOS and NMOS transistors in schematic design in FIG. 5 so to that the drain and source terminals are oriented for proper operation as described above.

Figure 6:
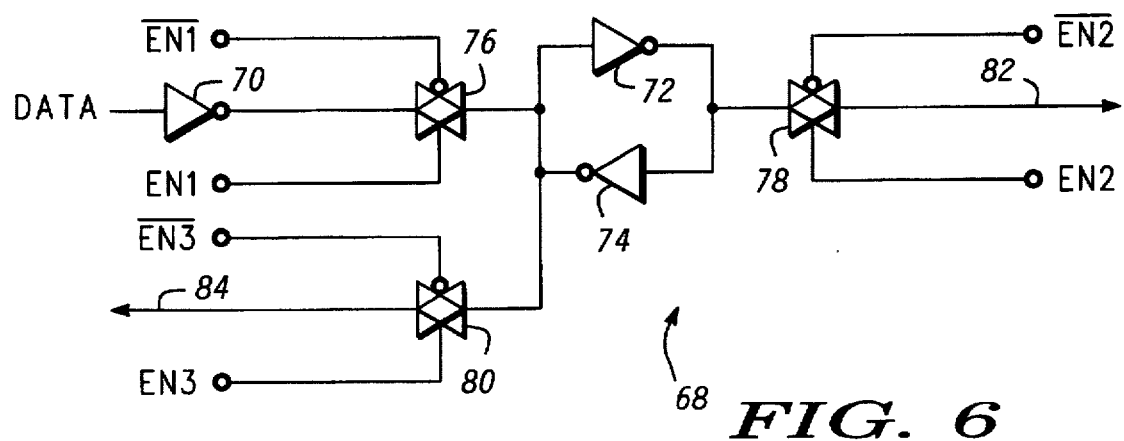
FIG. 6 is a schematic diagram illustrating yet another circuit design.

Next consider another circuit schematic variation such SRAM 68 shown in FIG. 6. DATA is complemented by inverter 70 and passed onto inverters 72 and 74 when transmission gate 76 is enabled by control signals EN1 and $\overline{EN1}$. Inverter 70 over-rides the prior state of inverters 72 and 74 and latches the DATA signal. DATA is read from the output of inverter 72 by enabling transmission gate 78 with control signals EN2 and $\overline{EN2}$. $\overline{DATA}$ is read from the output of inverter 74 by enabling transmission gate 80 with control signals EN3 and $\overline{EN3}$.

Inverters 70, 72, and 74 have their drain and sources terminals coupled between known sources of operating potential and are therefore analyzed according to the steps of FIG. 2. Transmission gate 76 comprises back-to-back NMOS and PMOS transistors as shown for transmission gate 60 each having one conduction terminal coupled to the output of inverter 70 and one conduction terminal coupled to a receiving node at the input of inverter 72 and the output of inverter 74. Control signal EN1 is applied to the gate of the NMOS transistor and control signal $\overline{EN1}$ is applied to the gate of the PMOS transistor in transmission gate 76. Transmission gate 78 comprises back-to-back NMOS and PMOS transistors as shown for transmission gate 60 each having one conduction terminal coupled to the output of inverter 72 and one conduction terminal coupled to a receiving node at node 82. Control signal EN2 is applied to the gate of the NMOS transistor and control signal $\overline{EN2}$ is applied to the gate of the PMOS transistor in transmission gate 78. Transmission gate 80 comprises back-to-back NMOS and PMOS transistors as shown for transmission gate 60 each having one conduction terminal coupled to the output of inverter 74 and one conduction terminal coupled to a receiving node at node 84. Control signal EN3 is applied to the gate of the NMOS transistor and control signal $\overline{EN3}$ is applied to the gate of the PMOS transistor in transmission gate 80. Again, a primary concern is that the drain and source terminals of the transistors in transmission gates 76, 78, and 80 are not coupled between known power supply conductors as in FIG. 1.

The lay-out process for the schematic design shown in FIG. 5 involves first analyzing inverters 70, 72, and 74 according to the steps described above in FIG. 2. Inverters 70-74 typically each comprise a PMOS transistor having a source terminal coupled to the positive power supply and an NMOS transistor having a source terminal coupled to ground. The lay-out process must have identified the driving-source into the conduction terminals of the respective transmission gates. The output of inverter 70 at the interconnection between the drains of its PMOS and NMOS transistors is pre-identified from the design information as the driving-source to transmission gate 76. Although inverter 74 is positioned as a possible driving-source into transmission gate 76, assume that inverter 70 is determined from the design information to be the actual driving-source to transmission gate 76 because it is sized larger and has greater driving capacity than inverter 74. The CAD lay-out software couples the sources of the asymmetrical NMOS and PMOS transistors in transmission gate 76 to the driving-source at the output of inverter 70. The drains of the asymmetrical NMOS and PMOS transistors in transmission gate 76 is coupled to the receiving node at the input of inverter 72.

The output of inverter 72 at the interconnection between the drains of its PMOS and NMOS transistors is pre-identified from the design information as the driving-source to transmission gate 78. The CAD lay-out software couples the sources of the asymmetrical NMOS and PMOS transistors in transmission gate 78 to the driving-source at the output of inverter 72. The drains of the asymmetrical NMOS and PMOS transistors in transmission gate 78 is coupled to receiving node 82.

The output of inverter 74 at the interconnection between the drains of its PMOS and NMOS transistors is pre-identified from the design information as the driving-source to transmission gate 80. The CAD lay-out software couples the sources of the asymmetrical NMOS and PMOS transistors in transmission gate 80 to the driving-source at the output of inverter 74. The drains of the asymmetrical NMOS and PMOS transistors in transmission gate 80 is coupled to receiving node 84.

Thus, the asymmetric NMOS and PMOS transistors in transmission gates 76, 78, and 80 have been identified and oriented through CAD lay-out software so that the source terminals are coupled to the driving-source and the drain terminals are coupled to receiving nodes, e.g. input of inverter 72, and nodes 82 and 84. The computer implemented method of the present invention has laid-out the asymmetrical PMOS and NMOS transistors in schematic design in FIG. 6 so to that the drain and source terminals are oriented for proper operation as described above.

In some cases, for example N:1 multiplexing configurations where $N \geq 3$, more than one input path may potentially drive an intermediate transmission gate. The orientation software must identify from the design information which paths can be enabled at any given time and thereby determine the driving-source into the respective transmission gate. Note that for the case of series and parallel connections of transmission gates, the orientation is still performed by following the driving source. For example, if two transmission gates are connected in series, then a driving-source is identified according to the logic configuration for the first transmission gate in the series and the same driving-source continues through the first transmission gate to the second transmission gate in the series.

By now it should be appreciated that the present invention provides a computer implemented method of orienting and laying-out the asymmetrical PMOS and NMOS transistors in a schematic design so to that the drain and source terminals are oriented for proper operation. The schematic may be a prior design or new design. The performance of the design can be improved by using asymmetrical semiconductor devices. The CAD software lay-out tool allows those asymmetrical devices to be automatically oriented and laid-out for manufacturing.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A computer implemented method of orienting asymmetrical semiconductor devices in an integrated circuit, comprising the steps of:

providing first and second operating potentials where said first operating potential is more positive than said second operating potential;

combining a first type of asymmetrical semiconductor device between said first operating potential and a common node into a first combination block that includes only the first type of asymmetrical semiconductor device;

combining a second type of asymmetrical semiconductor device between said common node and said second operating potential into a second combination block that includes only the second type of asymmetrical semiconductor device;

coupling a source terminal of one of said first type of asymmetrical semiconductor device to a first node operating at a first potential and coupling a drain terminal of said one of said first type of asymmetrical semiconductor device to a second node operating at a second potential less than said first potential in said first combination block; and coupling a source terminal of one of said second type of asymmetrical semiconductor device to a third node operating at a third potential and coupling a drain terminal of said one of said second type of asymmetrical semiconductor device to a fourth node operating at a fourth potential greater than said third potential in said second combination block.

2. The method of claim 1 wherein said step of combining a first type of asymmetrical semiconductor device includes the step of combining first transistors of said first type of asymmetrical semiconductor device to form a first combination block.

3. The method of claim 2 wherein said step of combining a first type of asymmetrical semiconductor device further includes the step of combining second transistors of said first type of asymmetrical semiconductor device to form a second combination block.

4. The method of claim 3 wherein said step of combining a first type of asymmetrical semiconductor device further includes the step of combining said first and second combination blocks to form an overall combination block of said first type of asymmetrical semiconductor device.

5. The method of claim 4 wherein said step of combining a second type of asymmetrical semiconductor device includes the steps of:

combining first transistors of said second type of asymmetrical semiconductor device to form a third combination block;

combining second transistors of said second type of asymmetrical semiconductor device to form a fourth combination block; and combining said third and fourth combination blocks to form an overall combination block of said second type of asymmetrical semiconductor device.

6. The method of claim 1 further oriented by the steps including:

identifying a driving source from said first and second combination blocks to a transmission gate that includes asymmetrical PMOS and NMOS transistors;

coupling a source terminal of said asymmetrical PMOS transistor to said driving source and a drain terminal of said asymmetrical PMOS transistor to a receiving node; and coupling a source terminal of said asymmetrical NMOS transistor to said driving source and a drain terminal of said asymmetrical NMOS transistor to said receiving node.

7. An apparatus for orienting an asymmetrical semiconductor device in an integrated circuit, comprising:

means for providing first and second operating potentials where said first operating potential is more positive than said second operating potential;

means for combining a first type of asymmetrical semiconductor device between said first operating potential and a common node into a first combination block that includes only the first type of asymmetrical semiconductor device;

means for combining a second type of asymmetrical semiconductor device between said common node and said second operating potential into a second combination block that includes only the second type of asymmetrical semiconductor device;

means for coupling a source terminal of one of said first type of asymmetrical semiconductor device to a first node operating at a first potential and coupling a drain terminal of said one of said first type of asymmetrical semiconductor device to a second node operating at a second potential less than said first potential in said first combination block; and means for a coupling source terminal of one of said second type of asymmetrical semiconductor device to a third node operating at a third potential and coupling a drain terminal of said one of said second type of asymmetrical semiconductor device to a fourth node operating at a fourth potential greater than said third potential in said second combination block.

8. The apparatus of claim 7 further including:

means for identifying a driving source from said first and second combination blocks to a transmission gate that includes asymmetrical PMOS and NMOS transistors;

means for coupling a source terminal of said asymmetrical PMOS transistor to said driving source and a drain terminal of said asymmetrical PMOS transistor to a receiving node; and means for coupling a source terminal of said asymmetrical NMOS transistor to said driving source and a drain terminal of said asymmetrical NMOS transistor to said receiving node.

9. The apparatus of claim 8 further including:

means for combining first transistors of said first type of asymmetrical semiconductor device to form a first combination block;

means for combining second transistors of said first type of asymmetrical semiconductor device to form a second combination block; and means for combining said first and second combination blocks to form an overall combination block of said first type of asymmetrical semiconductor device.

10. The apparatus of claim 9 further including:

means for combining first transistors of said second type of asymmetrical semiconductor device to form a third combination block;

means for combining second transistors of said second type of asymmetrical semiconductor device to form a fourth combination block; and means for combining said third and fourth combination blocks to form an overall combination block of said second type of asymmetrical semiconductor device.

11. An asymmetrical semiconductor device oriented by the steps comprising:

providing first and second operating potentials where said first operating potential is more positive than said second operating potential;

combining a first type of asymmetrical semiconductor device between said first operating potential and a common node into a first combination block that includes only the first type of asymmetrical semiconductor device;

combining a second type of asymmetrical semiconductor device between said common node and said second operating potential into a second combination block that includes only the second type of asymmetrical semiconductor device;

coupling a source terminal of one of said first type of asymmetrical semiconductor device to a first node operating at a first potential and coupling a drain terminal of said one of said first type of asymmetrical semiconductor device to a second node operating at a second potential less than said first potential in said first combination block; and coupling a source terminal of one of said second type of asymmetrical semiconductor device to a third node operating at a third potential and coupling a drain terminal of said one of said second type of asymmetrical semiconductor device to a fourth node operating at a fourth potential greater than said third potential in said second combination block.

12. The asymmetrical semiconductor device of claim 11 further oriented by the steps including:

identifying a driving source from said first and second combination blocks to a transmission gate that includes asymmetrical PMOS and NMOS transistors;

coupling a source terminal of said asymmetrical PMOS transistor to said driving source and a drain terminal of said asymmetrical PMOS transistor to a receiving node; and coupling a source terminal of said asymmetrical NMOS transistor to said driving source and a drain terminal of said asymmetrical NMOS transistor to said receiving node.

13. The asymmetrical semiconductor device of claim 12 further oriented by the steps including:

combining a first type of asymmetrical semiconductor includes the step of combining first transistors of said first type of asymmetrical semiconductor device to form a first combination block;

combining a first type of asymmetrical semiconductor further includes the step of combining second transistors of said first type of asymmetrical semiconductor device to form a second combination block; and combining said first and second combination blocks to form an overall combination block of said first type of asymmetrical semiconductor device.

14. The asymmetrical semiconductor device of claim 13 further oriented by the steps including:

combining first transistors of said second type of asymmetrical semiconductor device to form a third combination block;

combining second transistors of said second type of asymmetrical semiconductor device to form a fourth combination block; and combining said third and fourth combination blocks to form an overall combination block of said second type of asymmetrical semiconductor device.

* * * * *